United States Patent [19]

Jensen

[11] Patent Number: 4,464,120
[45] Date of Patent: Aug. 7, 1984

[54] SIMULATOR SYSTEMS FOR INTERACTIVE SIMULATION OF COMPLEX DYNAMIC SYSTEMS

[76] Inventor: Kaj Jensen, 4, Kaerparken, DK-2800 Lyngby, Denmark

[21] Appl. No.: 346,240

[22] Filed: Feb. 5, 1982

[51] Int. Cl.³ .............................................. G09B 9/00
[52] U.S. Cl. .................................. 434/219; 434/366; 434/224; 434/201; 364/801
[58] Field of Search ............... 434/118, 219, 224, 365, 434/366, 201; 364/200, 801, 900, 419

[56] References Cited

U.S. PATENT DOCUMENTS

| | | | |
|---|---|---|---|
| 3,071,876 | 1/1963 | Swanberg | 434/366 |
| 3,203,114 | 8/1965 | Adler | 434/224 |
| 3,278,736 | 10/1966 | Pastoriza | 364/419 |
| 3,310,883 | 3/1967 | Young | 434/366 |
| 3,363,333 | 1/1968 | Alexander | 434/118 |
| 3,447,249 | 6/1969 | Greger | 434/224 |
| 3,546,793 | 12/1970 | Roelofs et al. | 434/118 |
| 3,728,534 | 4/1973 | Bertram | 434/118 |
| 4,091,550 | 5/1978 | Schrenk et al. | 434/366 |
| 4,167,821 | 9/1979 | Gibson et al. | 434/219 |
| 4,213,253 | 7/1980 | Gudelis et al. | 434/224 |
| 4,259,077 | 3/1981 | Keweza | 434/118 |
| 4,315,320 | 2/1982 | Gabriel | 434/118 |
| 4,316,720 | 2/1982 | Ackerman | 434/366 |

Primary Examiner—Richard C. Pinkham
Assistant Examiner—Leo P. Picard
Attorney, Agent, or Firm—Bucknam and Archer

[57] ABSTRACT

A simulator and signal processing system for interactive simulation or signal processing of models of complex dynamic systems includes a range of basic hardware processor modules, each of which simulates or signal processes a system element corresponding e.g. to the symbols of System Dynamics. The hardware processor modules are placed in sockets arranged in regular rows and columns on an electronic planning board to form a flow diagram structure of the dynamic system to be simulated or signal processed. The electronic planning board comprises power lines for energizing the hardware processor modules and a high bandwidth local bus structure which transfer information signals between neighoring modules placed on the electronic planning board. The simulator and signal processing system permits a constant low simulation or signal processing time irrespective of the size or complexity of the model to be simulated or signal processed. The result of the simulation or signal processing is displayed on color monitors via the front-end system which performs as interface between the hardware processor modules on the electronic planning board and the monitors, or other peripherals.

2 Claims, 33 Drawing Figures

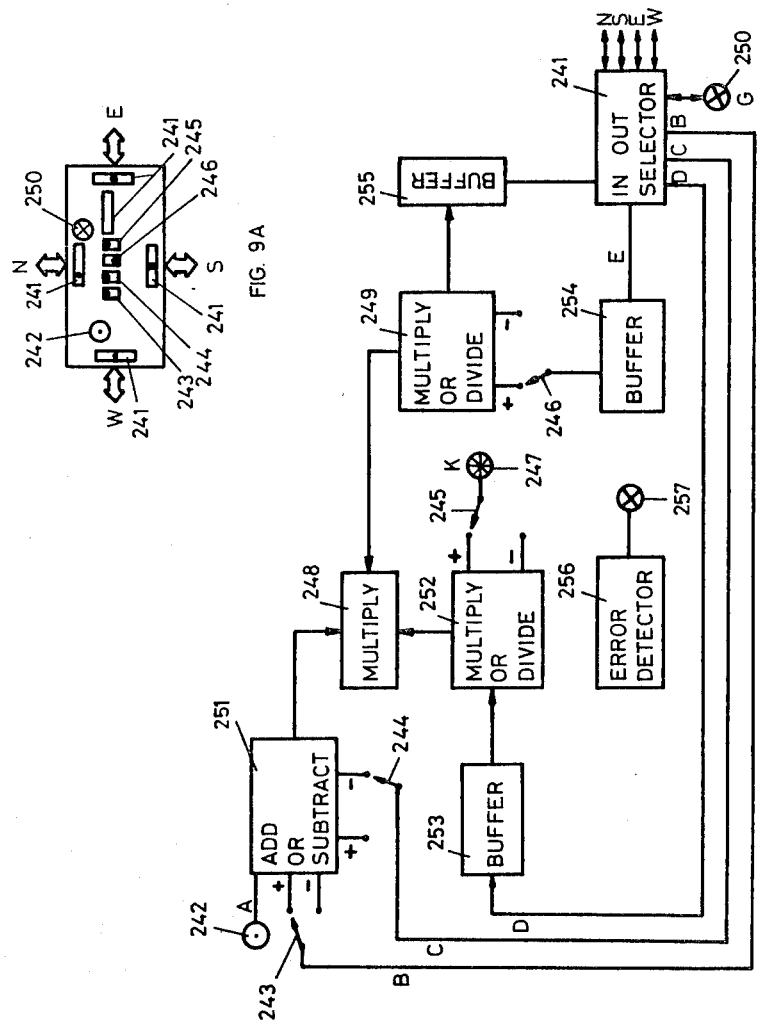

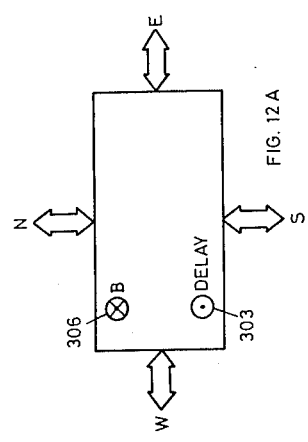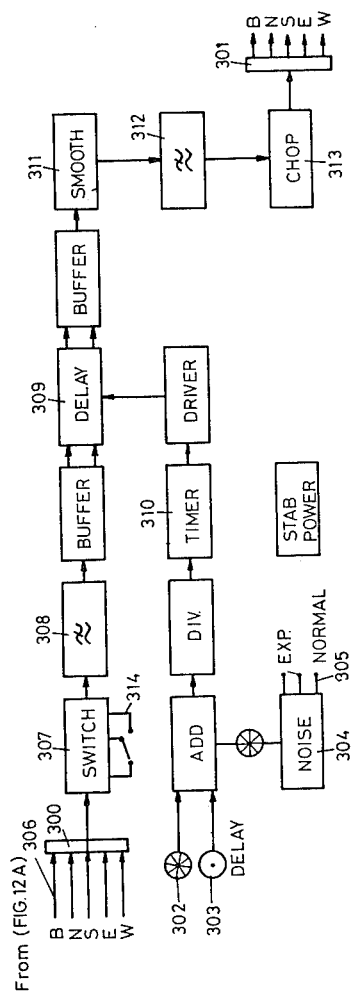

SIMULATOR SYSTEMS FOR INTERACTIVE SIMULATION OF COMPLEX DYNAMIC SYSTEMS

The present invention relates to a modular simulator and signal processing system for interactive simulation or signal processing of models of complex dynamic systems according e.g. to the concept of systems theory developed in System Dynamics.

In the Prior Art simulation of models of dynamic systems built along the lines of System Dynamics may be performed by a conventional digital computer using for example the simulation languages DYNAMO. The simulation may also be performed by a conventional analog computer. The digital computer requires in most cases extensive programming efforts even for simple models, and if a high simulation accuracy is desired e.g. for sensitivity analyses, the consumed calculation time becomes excessive. For conventional analog computers even a relatively simple model has great visual complexity because of the amount of wiring involved. More complex models are therefore very difficult to build and interact with.

It is an object of the present invention to provide a simulator system for simulating models of complex dynamic systems wherein software is avoided and easy interaction with the user is achieved and wherein the models of the dynamic systems to be simulated by the simulator system are built in a simple and well-arranged way on a planning board.

In accordance with the invention a simulator system comprises basic hardware electronic processor modules each simulative of a system element in e.g. System Dynamics as described in "Industrial Dynamics" by Jay W. Forrester (Massachusetts Institute of Technology, Cambridge, Mass. 1961), whereby software to a great extent is by-passed, and electronic planning boards on which the hardware electronic processor modules are placed so as to form a flow diagram of the model to be simulated.

The modular simulator system according to the invention comprises
- a range of basic hardware electronic processor modules,
- an electronic planning board including sockets and wiring for the processor modules,
- a front-end system performing as interface,
- color monitors for displaying the simulation results,
- other peripherals such as e.g. digitizer, CRT command terminal, tape stations and external computers.

The present invention is a hardware computer embodiment of e.g. the system elements of System Dynamics in the above mentioned "Industrial Dynamics" by Jay W. Forrester, whereby software to a great extent is avoided.

Models of physical systems are built on the electronic planning board by placing the electronic processor modules into sockets in the electronic planning board in such a way that they form a flow diagram structure of the models to be simulated. In a first embodiment of the invention the modular simulator system comprises twelve basic processor modules with the following names: LEVEL, RATE, AUXILIARY, NOISE, TABLE, DELAY, WAVEFORM, MAX-MIN, LOGIC-SWITCH, CORRELATOR, DIFFUSION, and SAMPLE. The LEVEL module describes the system states of a dynamic system, and the RATE and DIFFUSION modules describe flow to or from a system state of a dynamic system. The remaining basic modules control, if necessary, in one way or another LEVEL, RATE and DIFFUSION modules.

The function which is performed by a given electronic processor module is graphically depicted on the front plate of the module thereby facilitating the construction of a flow diagram structure of a model to be simulated on the electronic planning board.

In a first embodiment of the invention the electronic planning board comprises 8 sections each of which includes 64 multiconnection sockets i.e. accomodates up to 64 electronic processor modules. Operative electrical interconnection of the electronic processor modules on the electronic planning board is achieved by means of a special bus structure in the electronic planning board. The bus structure comprises
- local buses between neighbouring multiconnection sockets
- synchronizing signals to each electronic processor module
- power to each electronic processor module.

The local buses between each of the neighbouring multiconnection sockets provide operative electrical connection exclusively between a given electronic processor module and the neighbouring electronic processor modules when the given electronic processor module is plugged into the electronic planning board. By the provided close (high bandwidth) electrical interconnection of the electronic processor modules a practically unlimited number of processor modules can operate parallel in time, whereby a very high simulation speed is achieved. Furthermore, the simulation time is kept constant even when the size of the simulated models is expanded (due to the embodiment of the bus structure no bus-overload will occur).

The local buses carry analog and digital signals between neighbouring modules. The configuration of the short buses is similar for each multiconnection socket in the electronic board so that for example two neighbouring modules always are connected in the same way independent of their positioning on the electronic board.

In addition to this bus structure there can be provided electrical connection at the front plate of the processor modules for transferring analog and digital signals between any modules. This front plate electrical connection is used as local buses between non-neighbour modules or neighbouring modules.

Synchronizing signals, power and a communication line are carried by wires from each multiconnection socket to the front end via a switching network in the electronic planning board. These wires are different from the local buses.

The synchronizing ensures that the signal initial values of the module processors involved in the simulation are reached simultaneously for all the module processors during a simulation cycle (which lasts 1/25 sec.)

The communication line is used for communication between the front-end system and the processor modules. The communication may for example consist of an address from the front-end system to one of the modules with the object of providing information of the content of a memory in the module. The communication line may comprise a line set up by the switching network in the mentioned bus structure, or it may comprise a separate line.

The switching network set up lines between selected modules and the front-end system according to commands produced either by activating a Digitast placed on the low right-hand corner of the specified module or by specifying the address (position on the electronic planning board) of the modules using the front-end system. The front-end system performs as an interface between the electronic board and peripherals such as color monitors, digitizer, tape stations, operator console and other computers.

By activating the Digitast with one long touch may in this way simultaneously be shown curves on a color monitor of the simulation output in three colors (Red, Yellow, Green) in full lines, whereby simultaneous parallel comparison of simulation results from three different outputs in the flow diagram structure is made possible. The selection of color is made automatically by the front-end system which allocates colors sequentially, first red, then yellow and then green. By activating the Digitast with two short touches is obtained red, yellow and green curves in dotted line on the color monitor. The dotted line curves show the output from the electronic processor modules when they are in a simulation mode of the simulation cycle in which they are simulated as individual models and not as a flow diagram structure. This simulation mode is used for adjusting the parameters of the individual electronic processor modules constituting a flow diagram structure of a model to be simulated, thereby facilitating the interactive operation of the modular simulator system.

On the upper right-hand corner of each module three color light emitting diodes indicate to the user in what color the output from the module is illustrated on the monitor. When the diode flashes, it is an indication that the output from the module is shown as an dotted line, while if the diode lights permanently, it indicates that the output is shown in full line.

In addition to the above described six time varying outputs, the user may also on the monitor graphically obtain the relationship between the contents of two modules versus time. Such trajectory curves are shown in purple.

The invention will now be described in detail with reference to the drawings, in which FIG. 1A is a schematic partly perspective view of a first embodiment of the invention;

Figure 2A:
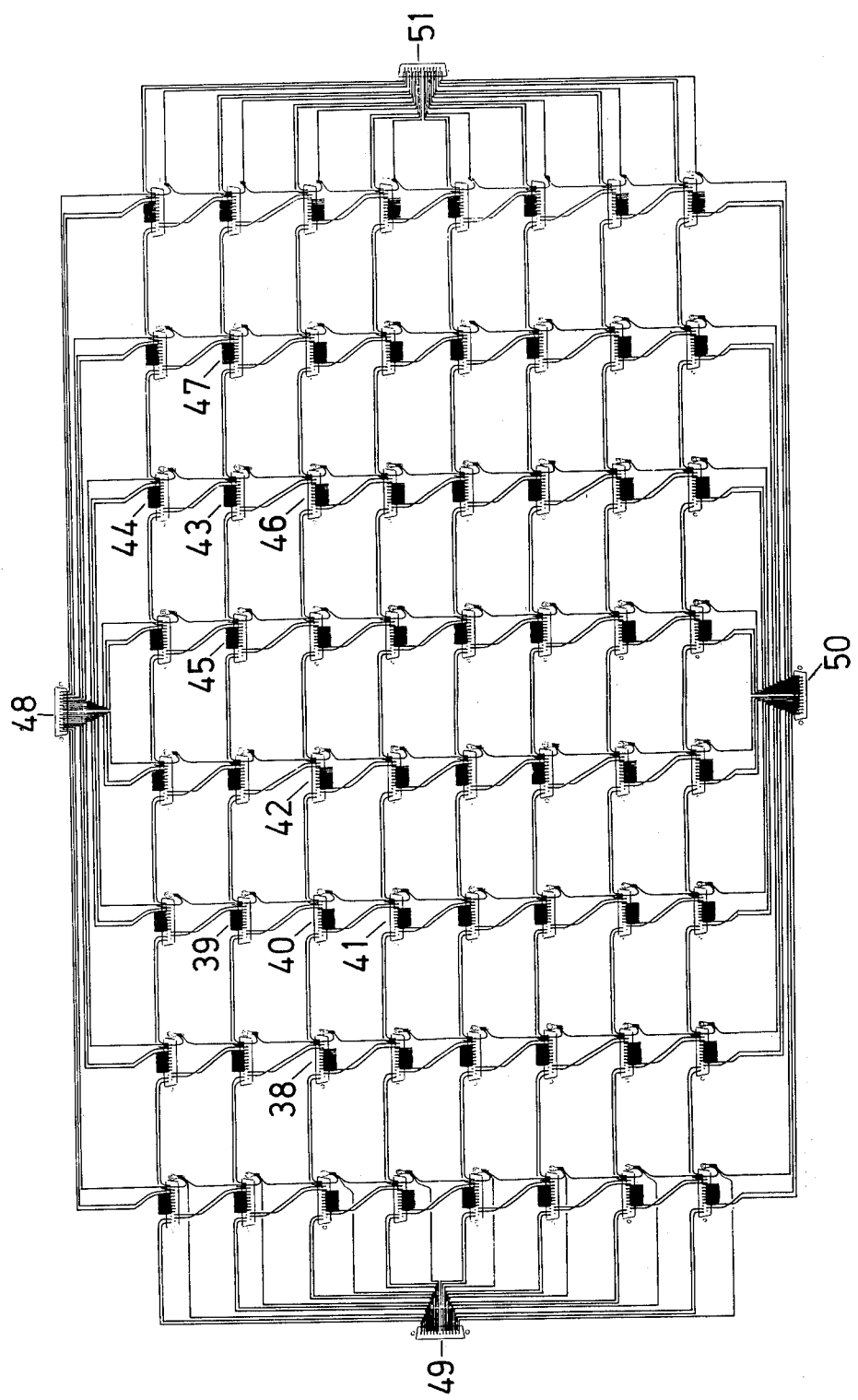
FIG. 2A represents the local bus structure in one electronic planning board section of the embodiment shown in FIGS. 1A and 1B.
Figure 2B:
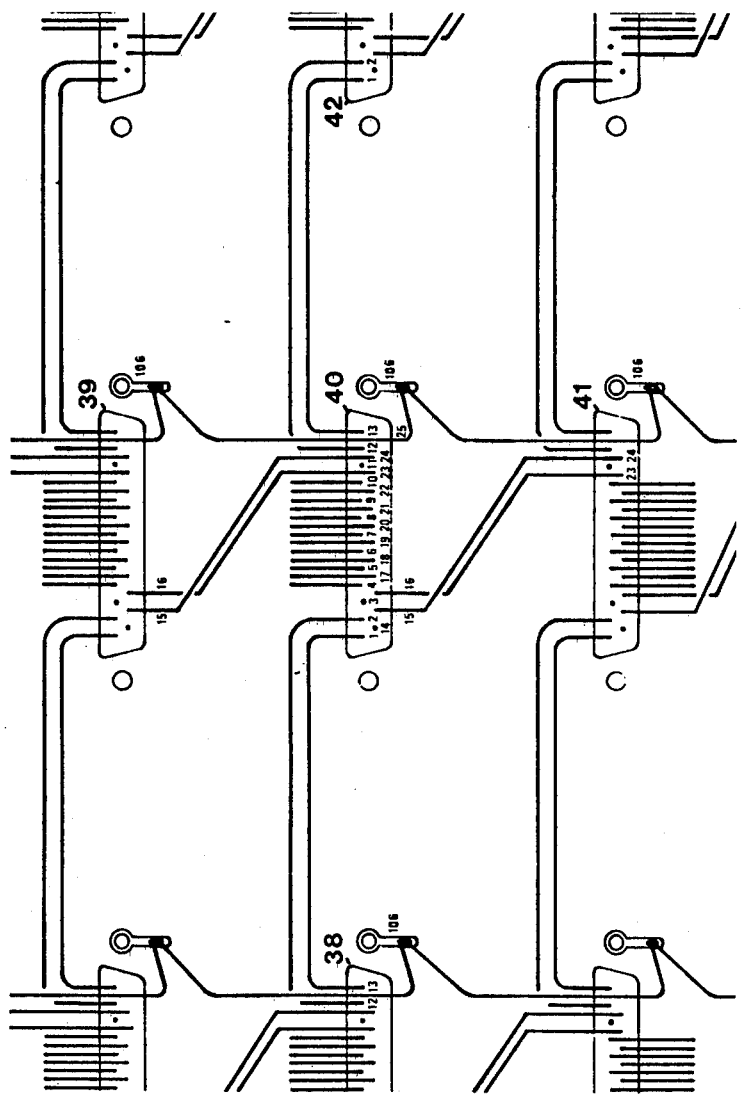
Figure 3:
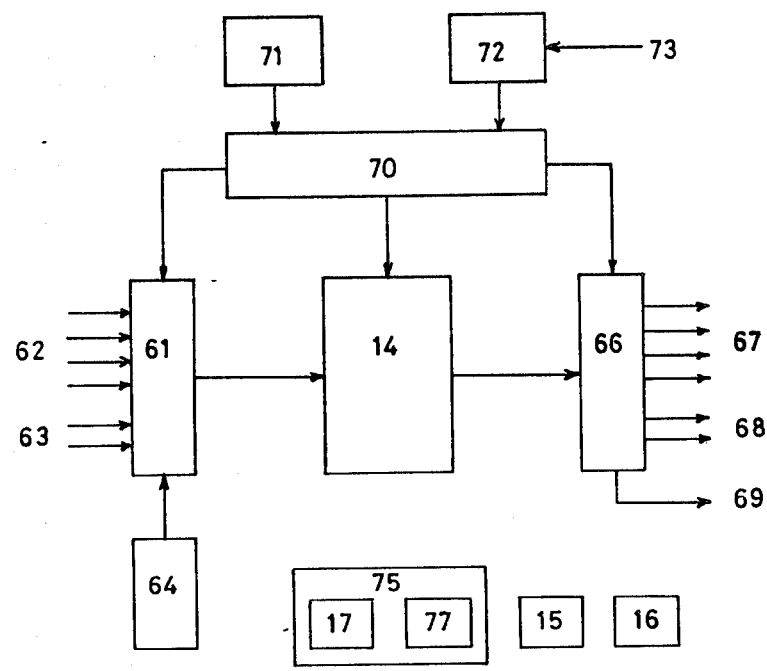
Figure 4:
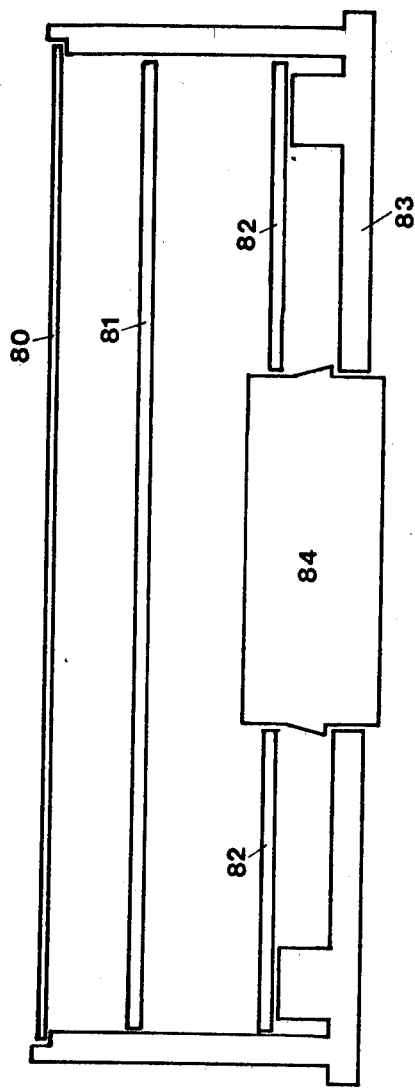
Figure 5:
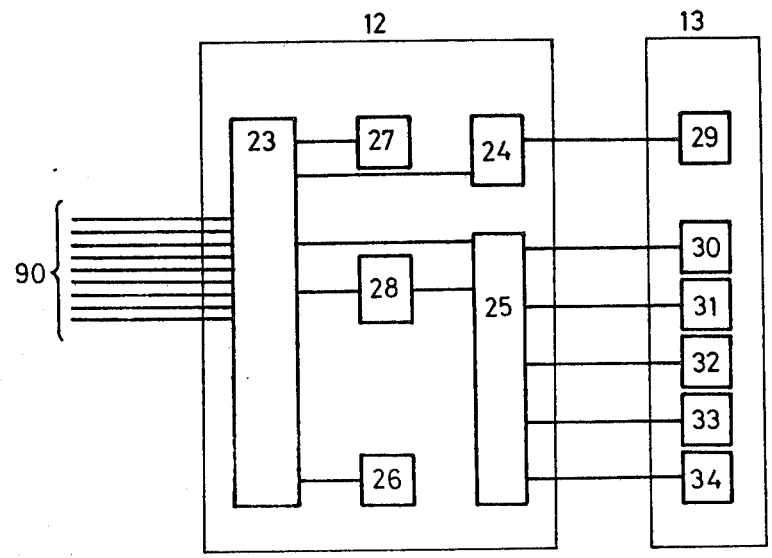
Figure 6:
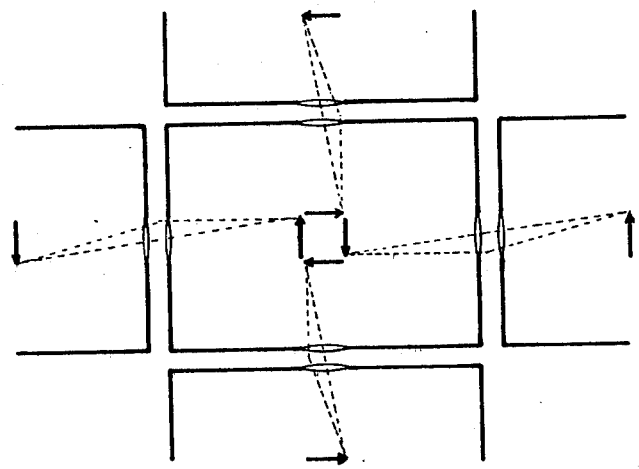
Figure 7A:
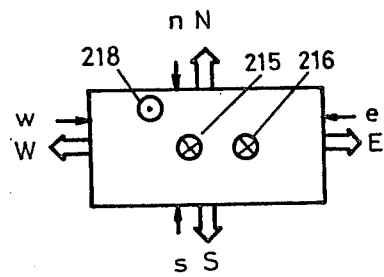
Figure 7B:
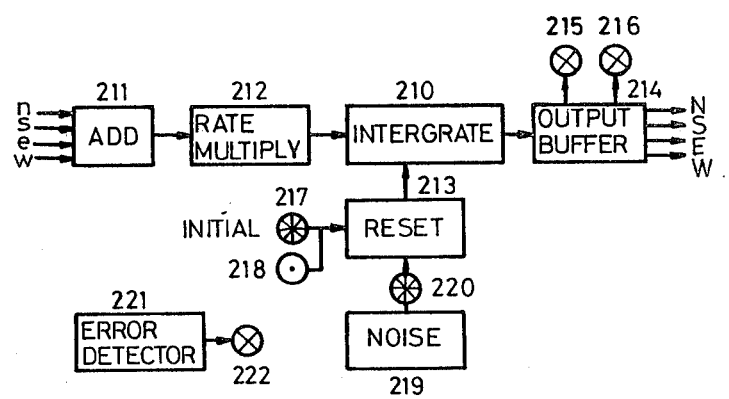
Figure 8A:
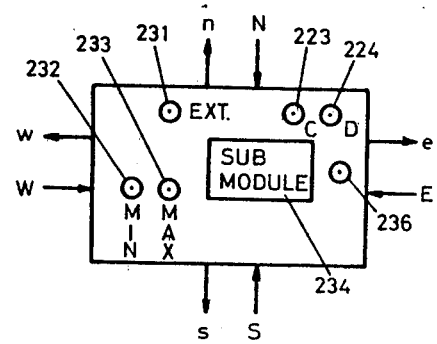
Figure 8B:
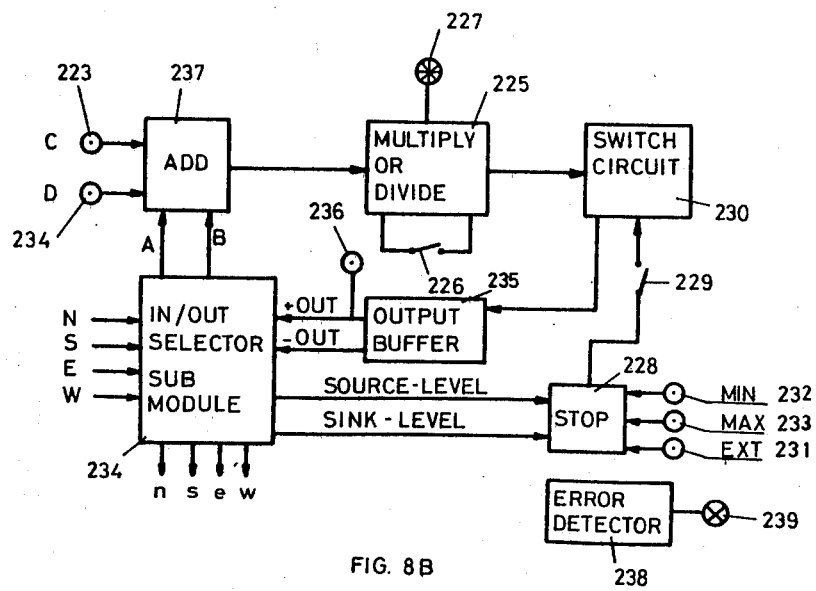
Figure 10A:
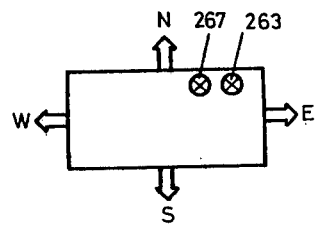
Figure 10B:
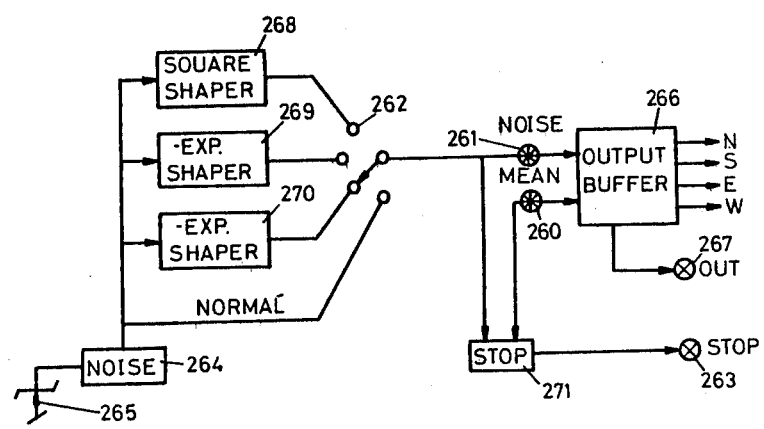
Figure 11A:
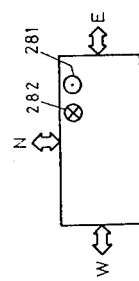
Figure 11B:
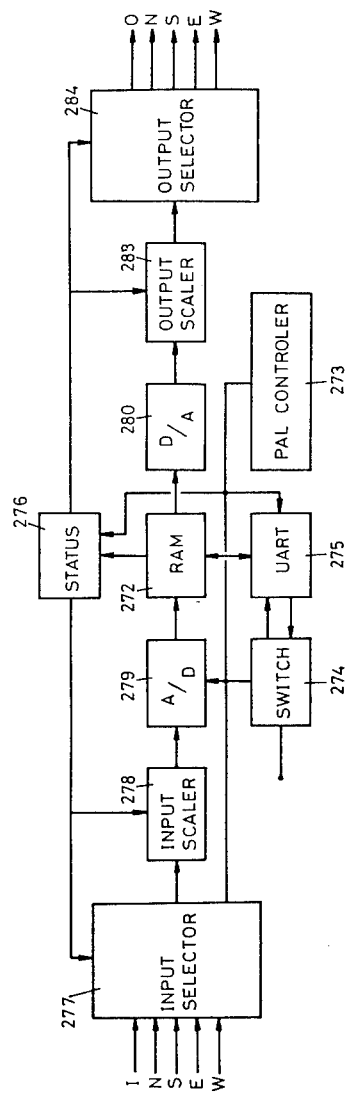
Figure 13A:
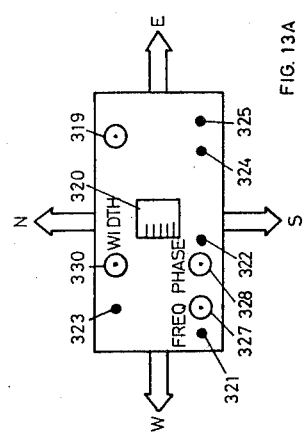
Figure 13B:
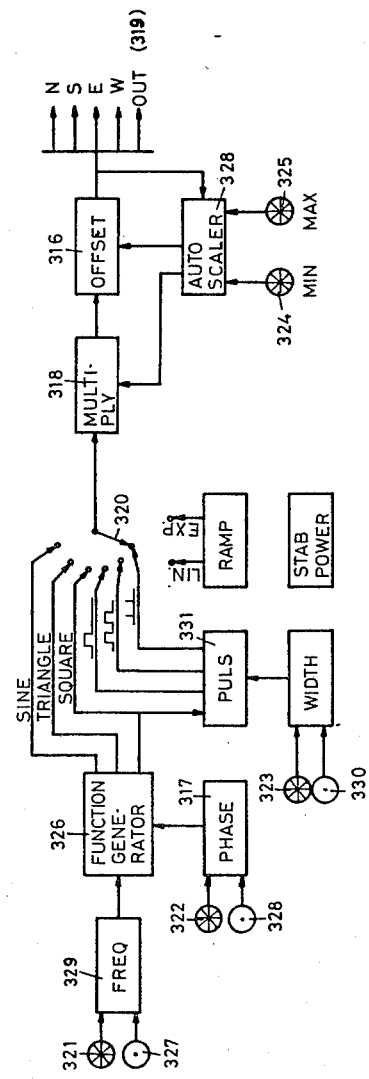
Figure 14:
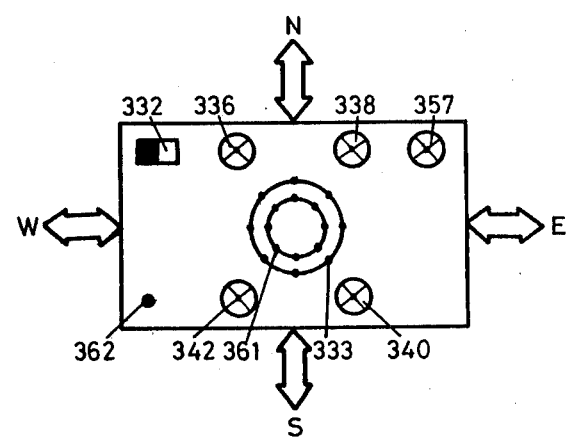
Figure 14B:
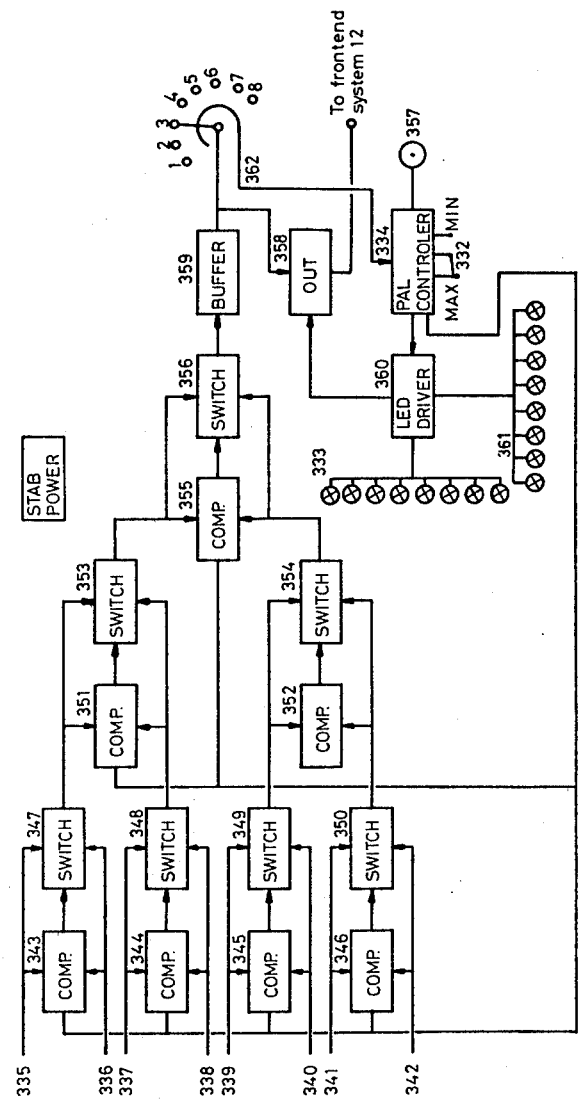
Figure 15:
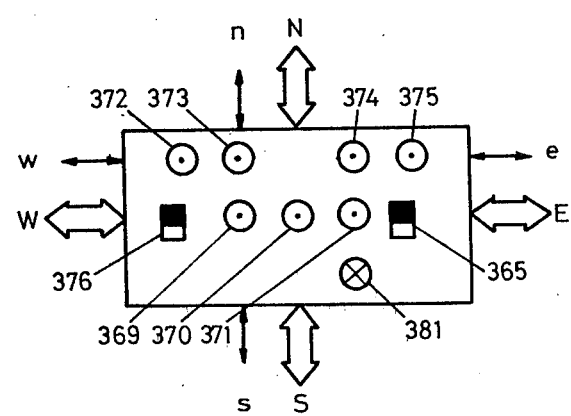
Figure 15B:
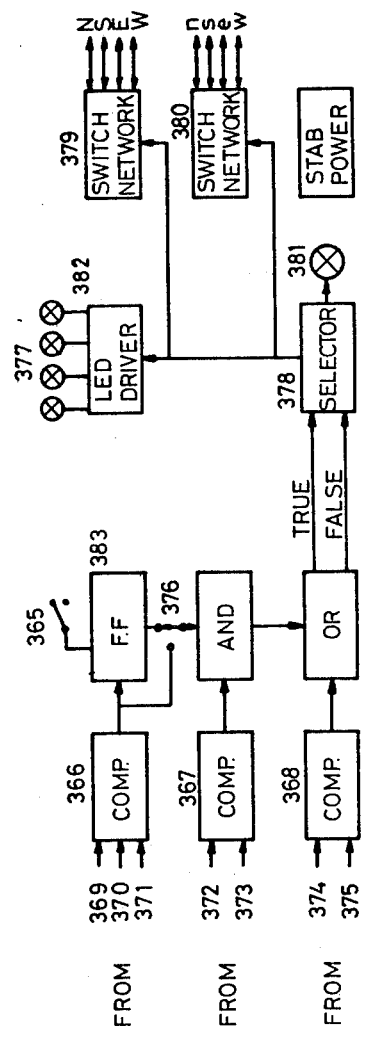
Figure 16A:
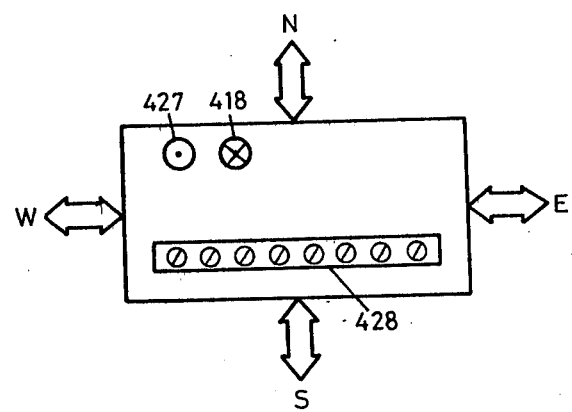
Figure 16B:
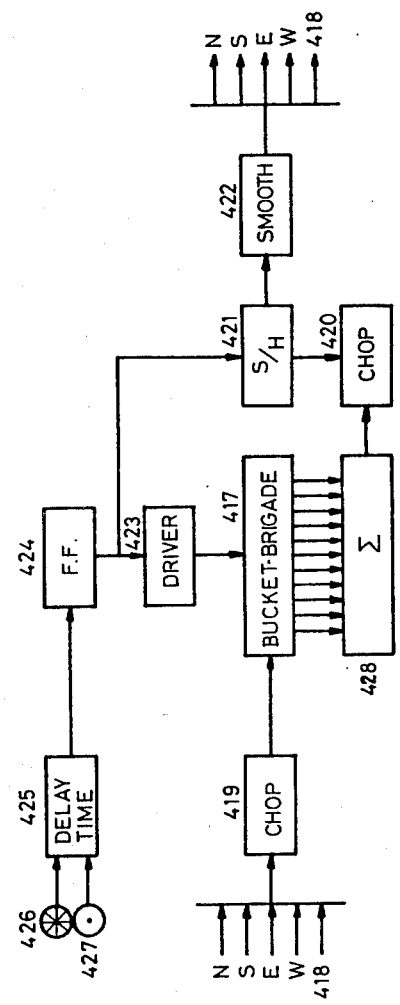
Figure 17A:
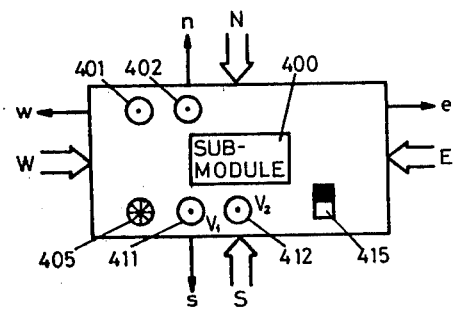
Figure 17B:
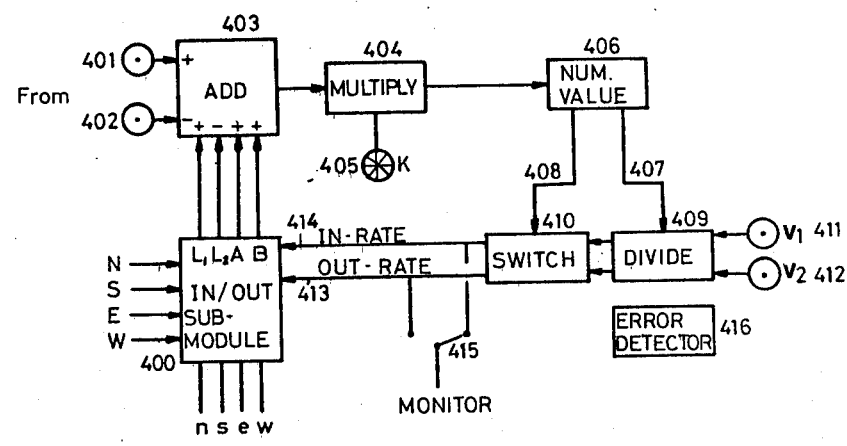
Figure 18A:
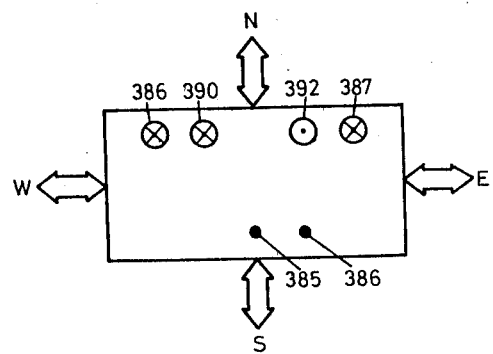
Figure 18:
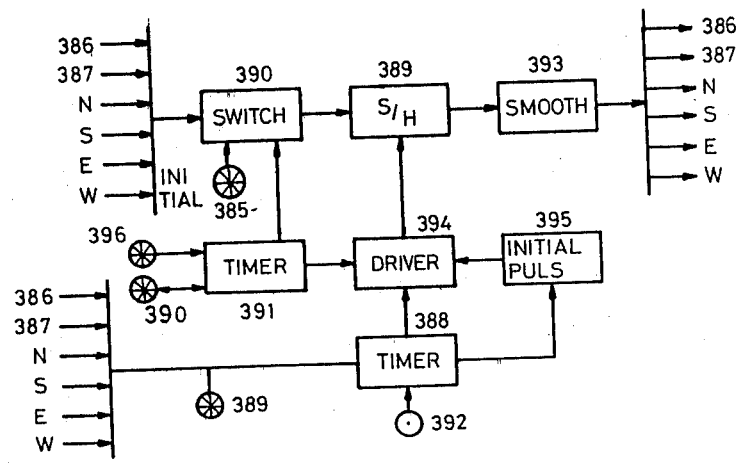

FIG. 2B in greater detail illustrates the local bus structure in FIG. 2A;

FIG. 3 is a functional block diagram of a processor module according to the first embodiment of the invention;

FIG. 4 is a sectional view of the mechanical construction of a processor module in the first embodiment of the invention;

FIG. 5 is a schematic functional block diagram of the front-end system and peripherals in the first embodiment of the invention;

FIG. 6 is a schematic view of an embodiment of the invention, in which the local bus comprises optical communication between light emitting diodes and light receiving means at the surfaces of the electronic processor modules, which oppose each other;

FIG. 7A is a schematic front view of a LEVEL module including schematic signal flows to and from the module;

FIG. 7B is a schematic functional block diagram of a LEVEL module;

FIG. 8A is a schematic front view of a RATE module including schematic signal flows to and from the module;

FIG. 8B is a schematic functional block diagram of a RATE module;

FIG. 9A is a schematic front view of an AUXILIARY module including schematic signal flows to and from the module;

FIG. 9B is a schematic functional block diagram of an AUXILIARY module;

FIG. 10A is a schematic front view of a NOISE module including schematic signal flows from the module;

FIG. 10B is a schematic functional block diagram of a NOISE module;

FIG. 11A is a schematic front view of a TABLE module including schematic signal flows to and from the module;

FIG. 11B is a schematic functional block diagram of a TABLE module;

FIG. 12A is a schematic front view of a DELAY module including schematic signal flows to and from the module;

FIG. 12B is a schematic functional block diagram of a DELAY module;

FIG. 13A is a schematic front view of a WAVE-FORM module including schematic signal flows from the module;

FIG. 13B is a schematic functional block diagram of a WAVE-FORM module;

FIG. 14A is a schematic front view of a MAX-MIN module including schematic signal flows to and from the module;

FIG. 14B is a schematic functional block diagram of a MAX-MIN module;

FIG. 15A is a schematic front view of a LOGIC-SWITCH module including schematic signal flows to and from the module;

FIG. 15B is a schematic functional block diagram of a LOGIC-SWITCH module;

FIG. 16A is a schematic front view of a CORRELATOR module including schematic signal flows to and from the module;

FIG. 16B is a schematic functional block diagram of a CORRELATOR module;

FIG. 17A is a schematic front view of a DIFFUSION module including schematic signal flows to and from the module;

FIG. 17B is a schematic functional block diagram of a DIFFUSION module;

FIG. 18A is a schematic front view of a SAMPLE module including schematic signal flows to and from the module;

FIG. 18B is a schematic functional block diagram of a SAMPLE module.

Figure 1A:
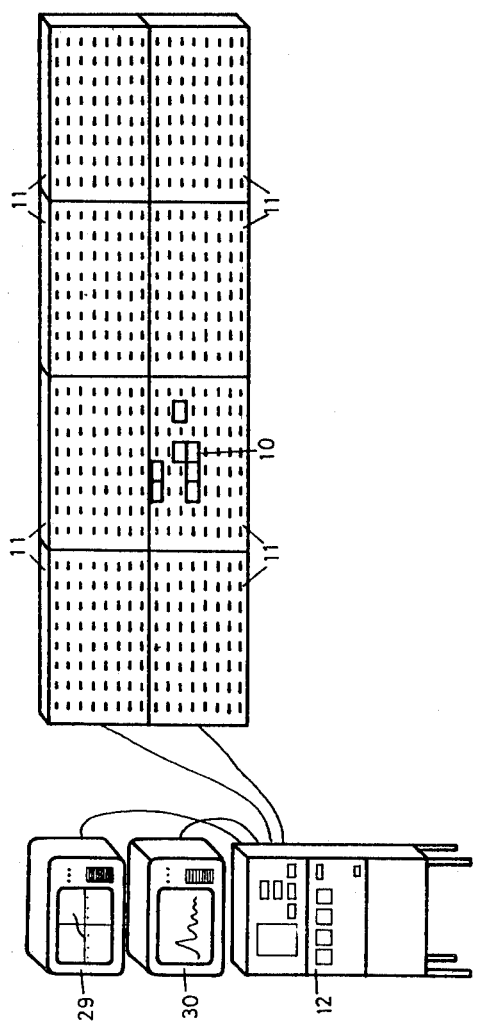
FIG. 1B shows a schematic functional block diagram of the embodiment shown in FIG. 1A.
FIG. 1C is a schematic partly perspective view of a second embodiment of the invention.
Figure 1B:
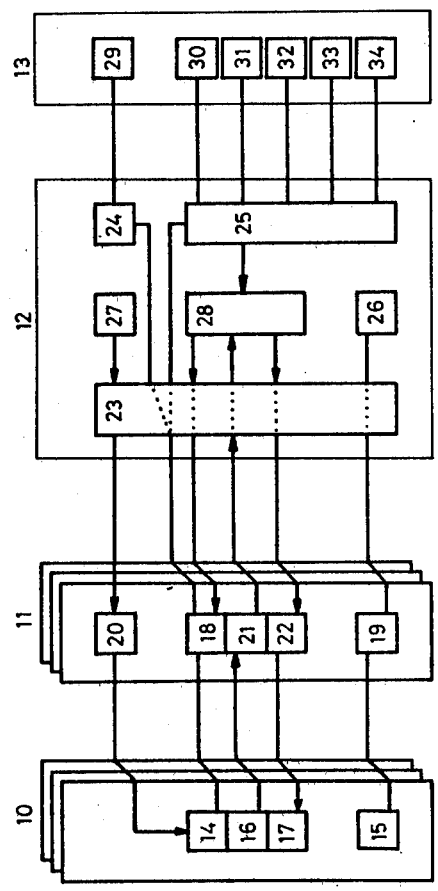
Figure 1C:
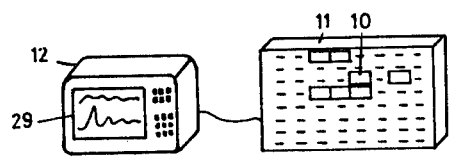

As shown in FIGS. 1A and 1B a first embodiment of the invention comprises a number of basic hardware processor modules 10, a number of electronic planning boards 11, on which the hardware processor modules 10 are placed, a front-end system 12 and a collection of peripherals 13. In a first embodiment of the invention the number of boards constitute eight with possiblity of expansion. A second embodiment comprises one single electronic planning board (FIG. 1C). The user communicates interactively with the modules via the peripherals which may include a color monitor 29, a CRT command terminal 31, tape stations 32, a digitizer 33 and an external computer 34. Each processor module 10 comprises a signal processor 14 and a separate power regulator 15, which supplies regulated power to the signal processor 14. The signal processor 14 includes circuitry, which performs a function corresponding e.g. to a system element of the symbols of System Dynamics. A first embodiment of the invention includes twelve (different) basic modules, the names and functions of which are illustrated in Table I.

Table I

BASIC MODULAR SIMULATOR SYSTEM MODULES

The LEVEL module simulates accumulations, e.g., the balance of an account, the number of persons in a company, the quality of goods in stock, or the concentration of oxygen in a water stream.

The RATE module simulates the flow to and from a level module, e.g. a production unit between two buffer inventories in a company, transfer of money between two accounts, transport of supplies, growth rates, addition of interest, and energy flow.

The AUXILIARY module simulates a variable, which is calculated by the means of the four basic arithmetic operations (+, −, ÷, ×), e.g., energy consumption per capita.

The NOISE module simulates a constant value or volume to which uncertainty is added according to probability distributions, e.g. the rate of interest and inflation.

The TABLE model simulates a tabular function (two-dimensional dependence) e.g., the income tax rate as a function of the taxable income.

The DELAY module simulates a delay in time, e.g., time of delivery.

The WAVEFORM module simulates functions, on which a model is printed e.g., the fluctuations of the market and imprinted external events in the environment of a system.

The MAX-MIN module simulates current selection of the biggest or smallest function among various time functions, e.g., the application of the cheapest energy source.

The LOGIC-SWITCH module simulates structural modifications on the basis of logical relations, e.g., engagement of a subcontractor for the supplementing production in a company, which has undercapacity and disengagement of the subcontractor in an overcapacity situation.

The CORRELATOR module simulates the dynamic weight distribution with 32 conditions of a parameter, e.g., total salary expenses with regard to seniority bonus or the effectiveness of machines regarding obsolescence.

The DIFFUSION module simulates the flow to and from level modules which contain concentrations (as a relative value as opposed to absolute holdings), e.g., a membrane between reservoirs with different volume.

The SAMPLE module simulates periodic measuring, where each measure is kept steady until the next updating, e.g., updating of sales prices and salaries or delays in time when delivering goods.

The processor module 10 communicates via a special bus-structure, which will be described in details below, a switching network 18, a channel unit 23 and a monitor interface 24 with a color monitor 29, on which can be shown output curves from the modules in three colors (R, Y, G). These curves illustrate the results of the simulation performed by processor modules arranged into a desired flow diagram structure. The curves may either be in full line or in dotted line. The full line curve represents the results from a specified module 10 of a simulated model i.e. the output result from the module in that point of the model (flow diagram structure) which is defined by the specified module 10. On the other hand the dotted line curve represents the result of a simulation of the specified module 10 on itself. This self-simulation or internal simulation is performed by an internal circuit which 25 times per second switches an internal signal generator (64 in FIG. 3) to and from the input of the signal processor 14 of the module while the external signals to the specified module are switched with the same rate in such a way that an external and an internal signal alternating is applied to the input of the signal processor 14.

The period in which the interconnected processor modules are simulated as a system (i.e. the complete flow diagram of the simulated model) is called the "run" period, and the period in which the modules are performing self-simulation is called the "scan" period. The "run" and "scan" periods form part of the following complete cycle, which lasts 1/25 sec.

RESET
RUN
RESET
SCAN
RESET
etc.

In the "reset"-intervals, the inputs of the signal processors 14 are resetted. The individual periods of the simulation cycle are clocked by a system clock 27 in the front-end system 12. The synchronizing signals from the system clock 27 are via the channel unit 23 supplied to a synchronizing network 20 in the electronic planning boards 11. From the synchronizing network 20, which substantially comprises buffer circuits and distribution network to the electronic processor modules, the synchronizing signals are supplied to the electronic processor modules, whereby synchronization of each electronic processor module in a flow-diagram structure of a simulated model is achieved, i.e. the initial values of the electronic processor modules in the (above discussed) simulation cycle are synchronized. The dotted curves of the self-simulation or internal simulation is used for adjusting the parameters of a specified module in a given flow diagram structure. These two ways of illustrating the result of the simulation and the self-simulation respectively are controlled by activating a digitast 16 on the front plate of the processor module. One long touch of the digitast 16 results in a full line curve and two short touches following immediately after each other results in a dotted line curve. One short touch cancels the output from the module. The digitast 16 communicates with an encoder circuit 21 in the electronic board 11. The encoder circuit 21 encodes the address of the digitast touch sequence, i.e. the position of that specific module on the electronic board 11 on which the digitast 16 has been depressed and encodes further the touch sequence. The encoded result from the output of the encoder 21 is via channel unit 23 communicated to a channel monitor 28 in the front-end system 12, which via channel unit 23 allocates an available channel e.g. red and supplies a load signal to the switching network 18 and a LED decoder 22, whereby the address from the encoder circuit is loaded into the switching network 18 and the LED decoder 22. This results in a signal path being provided between signal processor circuit 14 and color monitor 29 via switching network 18, channel unit 23 and monitor interface 24 or, if suitable commands have been supplied to e.g. a peripheral CRT command terminal 31, between signal processor circuit 14 and color monitor 30 via switching network 18, channel unit 23 and a front-end computer 25. The provided signal path permits illustrating of the simulation result on color monitor 29 or color monitor 30 in a certain color (R,Y,G). The color is shown by a LED 17 on the specified module by means of a LED decoder 22 which decodes the address loaded into it from channel monitor 28 and activates the LED 17 corresponding to the decoded address and to the color of the curve of the simulation result on the color monitors 29,30. If the LED 17 lights permanently this corresponds to a full line curve on the color monitor 29, whereas a flashing LED 17 corresponds to a dotted line curve on the color monitor. The color monitor 29 is used exclusively for showing the output result of the simulation from the modules, whereas the color monitor 30 can show output from one module at a time as well as table functions. Table functions and output results stored on a tape station 32 of the front-end system 12 can also be retrieved to the color monitor 30. Thus up to six outputs may be shown simultaneously, e.g. three curves in respectively red, yellow and green in full line representing the outputs of three different processor modules 10 in a simulated model (or three different points in the flow diagram structure), and three curves in respectively red, yellow and green in dotted line representing the internal simulation of f. ex. three other processor modules. Hereby simultaneous comparison of the simulation (full line) in three different points of the flow diagram structure is made possible.

BUS STRUCTURE

In FIG. 2A is illustrated the bus structure according to a first embodiment of the invention in one section of the electronic planning board 11 comprising $8 \times 8$ multi-connection sockets for receiving hardware processor modules 10. The bus structure comprises local bus between all positions on the electronic board
synchronizing signals to each processor module
power to each processor module
communication line between each processor module and the front-end system.

The configuration of the local bus is such that short high bandwidth buses are provided between each of the neighbouring sockets i.e. a module which is placed in a given socket communicates with its neighbouring modules only on the electronic board 11. Consider for example a module which is placed in a socket e.g. the socket indicated at 40 in FIG. 2A. Due to the mentioned special local bus structure according to a first embodiment of the invention, the module in this socket 40 can only communicate with modules on the electronic board which are placed in neighbouring sockets occupying the positions N (indicated at 39), W (indicated at 38), S (indicated at 41) and E (indicated at 42). The configuration of the short buses is similar for all sockets in the electronic board so that for example two neighbouring modules always are connected in the same way independent of their positioning on the electronic board. The short buses carry analog and digital information signals between neighbouring modules.

In FIG. 2B the local bus structure is shown in greater details. Again the socket 40 is used as illustrated example together with the neighbouring sockets 39 (position N), 38 (position W), 41 (position S) and 42 (position E). Pins 1 and 2 in socket 40 are connected through short buses to pins 12 and 13 respectively in socket 38 (position W), and pins 12 and 13 in socket 40 are connected to pins 1 and 2 respectively in socket 42 (position E). Similarly pins 15 and 16 in socket 40 are connected to pins 24 and 23 respectively in socket 41 (position S), and pins 23 and 24 in socket 40 are connected to pins 16 and 15 respectively in socket 39 (position N). The interconnection described above in respect of socket 40 and its neighbouring sockets 38 (position W), 41 (position S), 42 (position E), 39 (position N) are the same for all similar groups of sockets anywhere on the electronic board, such as between (e.g.) socket 43 and 44 (position N), 45 (position W), 46 (position S), 47 (position E). This connection of neighbouring modules can be continued between adjacent boards by use of four sockets 48, 49, 50 and 51 at the periphery of the board.

In addition to this local bus structure there can be provided electrical connection at the front plate of the processor modules for transferring analog and digital information signals between any modules. This front plate electrical connection is used as local buses between non-neighbour modules.

In an embodiment of the invention the communication between neighbouring modules is performed by light emitting electrical devices and light receiving electrical devices, which are arranged at the sides of the modules opposing each other when the modules are placed on the board and communicating directly without the use of optical cables, see FIG. 6.

Besides the local bus each socket comprises pins which leads synchronizing signals, power and communication signals to the processor module. The connection of the pins in a socket according to a first embodiment of the invention is illustrated in Table II. From Table II (and FIG. 2B) it is seen that a given socket includes two local bus lines to each position N, S, E, W. The two local bus lines are identical but to distinguish between them one is identified by a capital letter corresponding to the position relative to a given socket (i.e. N, S, E, W), while the other is identified by a small letter corresponding to the position relative to a given socket (i.e. n, s, e, w). In the pair of local buses from a socket to each position N, S, E, W one local bus line may be used for transmitting information signals from a module placed in the socket to neighbouring modules, and the other local bus line may be used for receiving information signals from neighbouring modules.

With the local bus structure according to the invention is achieved constant simulation time (10 ms, corresponding to the "run" period) independent of the size and complexity of the model to be simulated or signal processed. This is of importance when a large number of simulations have to be performed e.g. a series of simulations in which a parameter assumes a large number of discrete values.

TABLE II

Connection of pins in a socket

| Pin No. | |
|---|---|
| 1 | Local bus to neighbouring module in position W. |
| 2 | Local bus to neighbouring module in position w. |
| 3 | Not used. |
| 4 | − 18V power supply. |
| 5 | Select red light emitting diode. |
| 6 | Power ground. |
| 7 | Output from processor module. |
| 8 | Mode synchronizing signal. |
| 9 | Fast reset synchronizing signal. |
| 10 | + 8V power supply. |
| 11 | Not used. |
| 12 | Local bus to neighbouring module in position E. |
| 13 | Local bus to neighbouring module in position e. |
| 14 | Not used. |
| 15 | Local bus to neighbouring module in position S. |
| 16 | Local bus to neighbouring module in position s. |
| 17 | Select green light emitting diode. |
| 18 | Select yellow light emitting diode. |
| 19 | Output request from module. |
| 20 | Ramp-timer signal. |
| 21 | + 18V power supply. |
| 22 | Reset synchronizing signal. |
| 23 | Local bus to neighbouring module in position N. |
| 24 | Local bus to neighbouring module in position n. |
| 25 | Signal ground. |

HARDWARE PROCESSOR MODULE

Referring to FIG. 3 processor module 10 (e.g. LEVEL module) includes generally a signal processor 14 which processes signals supplied by an input selector 61 comprising an electronic and/or manual switching circuit. For example the signal processor 14 in a LEVEL module performs a signal processing consisting of integration of an input signal. The signal processor in other basic modules performs other forms of signal processing as described in greater detail later. The input selector 61 selects input signals 62 from neighbouring modules via pins in the sockets of the electronic board 11 and input signals 63 from non-neighbouring modules via front plate connectors or input signals generated by a signal generator circuit 64 within the module 10. The signals generated by signal generator 64 includes step function, pulse function and ramp function which are determined by a manually operated switch (not shown) on the front plate of the module. During the simulation process this selection of input signals to the signal processor 14 is performed in an alternating way with a predetermined repetition cycle rate of 25/sec. as described above. The input signals 62,63 are used in the flow diagram route for simulation of a model of dynamic systems, whereas the input signals from signal generator 64 is used for the previously described self-simulation or internal simulation. The input selector 61 may also comprise a manually operated switch for determining from which of the positions N, S, E, W the module 10 shall receive input signals. This selection of input signals to the module 10 from modules in positions N, S, E, W may also be performed via a memory 70 which is programmed either by manual programming 71 such as potentiometers or by remote programming by means of a microprocessor 72 which is controlled from the peripheral units 13 via a remote programming channel 73.

The memory 70 may via e.g. manual programming 71, furthermore control the function of the signal processor 14 e.g. which of the four basic arithmetic operations an AUXILIARY module shall perform or the initial values of a LEVEL module etc.

The processed signals from the signal processor 14 are supplied to an output selector 66 comprising a manually operated switch for determining to which of the positions N, S, E, W, the output 67 to the neighbouring modules shall be supplied or whether the processed signal shall be supplied to the output 68 to non-neighbour modules via front plate connectors on the module. The output from the output selector 66 includes furthermore output 69 (via pin 7 of Table II) to front-end system 12 and e.g. color monitor 29 via switching network 18 in the electronic board 11. Selection of one of the positions N, S, E, W for the output 67 may also be performed via the memory 70, which may be programmed either by manual programming 71 (including potentiometers and switches) or by remote programming by means of a microprocessor 72 via peripheral units 13.

Furthermore, the processor module 10 includes a display 75 on the front plate of the processor module comprising LED 17 and/or liquid crystals for displaying the color of the output 69 on the color monitors 29,30 and an overflow indicator 77, which indicates overflow of the electronic components (especially the analog components) of the system. Included in the circuit of the processor module 10 is an error detector (not shown) which monitors intermediately calculated values and output values during the "run" periodes. If any of the intermediately calculated values or output values are outside the range +10 V to −10 V it is indicated by overflow indicator 77. Overflow is identified on the screen of one of the color monitors 29,30 by a sharp upper or lower limit on the curves, and a warning is given by overflow indicator 77 on the corresponding module.

In FIG. 4 is illustrated the mechanical design of the processor modules 10. The mechanical design is similar for all the basic processor modules. The mechanical size and the connection of the mechanical parts of the modules are standardized. In FIG. 4 the processor module 10 comprises a metal front plate 80, an upper PCB deck 81, a lower PCB deck 82, a box shaped compartment 83 and a multiconnection socket 84.

FRONT-END SYSTEMS AND PERIPHERALS

Referring to FIG. 5 the front-end system 12 comprises a channel unit 23, which communicates with each electronic board 11 through a 50-pole cable 90. The front-end system 12 is common for all electronic boards 11 of which there exists eight in a first embodiment of the invention. The front-end system 12 is separate from the electronic boards and forms an interface between the electronic boards and the peripheral units 13 (color monitors, digitizer etc.). The channel unit 23 is a centre of communication, power distribution and synchronizing and includes eight buffer/driver circuit sections, one for each of the electronic boards 11. The signals received from the electronic board 11 (or boards 11) by the buffer/driver circuits are supplied to a central bus within channel unit 23. The power lines from a power supply 26 supplies power via the central bus or channel unit 23 to the power distribution network 19, in the electronic boards 11. The power lines are protected by fuses with light emitting diodes as blow-out indicators to prevent short circuits in one electronic board 11 from affecting normal operation of the rest of the system. Most of the other lines in the 50-pole cable 90 are also buffered to protect the central bus of channel unit 23 from hardware breakdown in subsystems and to drive the capacitive loads of the long flat cables to the electronic boards 11 and to shape noisy signals by line receivers.

Illustratively, the power consumption is 500 Watts when the load is one channel unit 23 and eight electronic boards 11 including processor modules. Local voltage regulators (reference number 15 in FIG. 1B) in each processor module 10 allow voltage drop on the power distribution network 19 and protects sensitive circuits from noise on the lines. Initial voltage of approximately (−9 V, +9 V, −19 V, +19 V) is finally regulated to (−5 V, +5 V, −15 V, +15 V) respectively.

In a first embodiment of the invention the front-end system 12 includes a system clock 27 which is connected to the central bus of channel unit 23. As previously disclosed system clock 27 supplies synchronizing signals to the "run" and "scan" periods of the simulation cycle via channel unit 23 and synchronizing network 20 in the electronic planning boards 11. The front-end system 12 includes also a monitor interface 24 performing as interface unit between channel unit 23 and a color monitor 29.

In a first embodiment of the invention monitor interface 24 expands a slightly modified colour television set to be a fast graphic color monitor with a storage capability of 65K bytes. Input from eight analog lines are alternated two and two, digitized to 256 levels in amplitude and 512 levels in time and stored. Each picel in the video storage contains 4 bits, named R, G, B, T.

The red color is switched on by R, the green color by G and the blue color by B. Additive color mixture gives additional colors. Picels are divided into two classes by T—one for "run" outputs and one for "scan" outputs.

Dark picels (O, O, O, T) are automatically inserted in the "scan" outputs to make dotted lines.

The color T.V. picture consists of 131072 picels in a matrix with 256 rows and 512 columns.

Non-interlaced scan is used to give a calm picture. The picture is updated 50 times a second by a 33 MBAUD line between monitor 29 and monitor interface 24.

Front-end system 12 includes furthermore a front-end computer 25 comprising an Intel 16 bit 8086 microprocessor. The primary function of front-end computer 25 is inlaying of tables in TABLE modules by means of the 8086 microprocessor. This is performed by inputting coordinate points of a desired functional relationship via a CRT command terminal 31 or by directly drawing the functional relationship on digitizer 33. The microprocessor of front-end computer 25 performs interpolation between the points which are inlaid by CRT command terminal 31 or digitizer 33. The contents of the inlaid tables may be displayed on color monitor 30 by means of the microprocessor of front-end computer 25. Color monitor 30 may also be used for displaying output from each processor module in the "run" period. The microprocessor of front-end computer 25 may furthermore save the said output of the processor modules on a tape station 32 for e.g. later displaying on color monitors 29 or 30. By means of the microprocessor of front-end computer 25 it is furthermore possible to exchange data between front-end system 12 and external computers 34 such as a digital computer. Programs on external computers 34 can be controlled by CRT command terminal 31.

The channel monitor 28 controls the red, the yellow and the green output lines from signal processor 14 (via switching network 18 in the electronic boards 11) and is connected to the central bus of channel unit 23, said central bus via the buffer/driver circuits in channel unit 23 and switching network 18 communicates with signal processor 14 in a processor module 10. The output lines are requested by activating a digitast 16 on any module. Three types of touch sequence are decoded. One long touch is requested for output from the module in the "run" period, two short touches are requested for output from the "scan" period, and one short touch is requested for cancelling output from the module. The digitast sequence and address (i.e. position of a module on the planning board) are transmitted from digitast encoder 21 to channel monitor 28 via channel unit 23 (i.e. via the buffer/driver circuits and central bus of channel unit 23). Instructions (e.g. from peripheral units 13 via front-end computer 25) retransmitted from channel monitor 28 to switching network 18 via channel unit 23 may be to latch the encoded address while the digitast 16 is activated or may be to transmit the address into a red run latch in switching network 18 if it has been decoded that the user wants output from the "run" period as a red curve on the color monitor (29 or 30). The output from a selected module to the monitors 29,30 is transferred via a communication line between the selected module and the channel unit 23. The communication line is established in every "run" period by an analog multiplexer in switching network 18 controlled by the run latch in switching network 18. Similarly, a communication line is established in the "scan" periods by the scan latch in switching network 18. A LED decoder 22 is also activated by the same address (via channel monitor 28). The decoded address activates a light emitting diode 17 on the corresponding module to show to the user that the line requested has been established.

Output from the "run" period is shown in red, yellow or green solid curves on the monitor screen with corresponding identification by red, yellow or green lamps on the modules.

Output from the "scan" period is also shown in the three colors, but in dotted lines referring to flashing lamps on the modules. The selection of colors is automatically sequenced individually for solid and for dotted lines—first red, then yellow, then green, then red and so on.

In the following will be given a detailed description of the signal processor circuit 14 of each of the twelve basic hardware processor modules according to a first embodiment of the invention.

LEVEL Module

The LEVEL module shown in FIGS. 7A and 7B simulates the contents over time of a variable, i.e. the initial value of a variable plus the accumulated input-/output difference. The input/output of the module can be supplied in two ways:
  by RATE modules, in which case the LEVEL has an absolute value (extensive variable)
  by DIFFUSION modules, in which case the LEVEL has a relative value (intensive variable).

The operation of the LEVEL module may be described as $$\text{LEVEL}(t) = m \int_0^t (n(t) + s(t) + e(t) + w(t))dt +$$

$$\text{LEVEL}(t=0)$$

where (FIG. 7A) n(t), s(t), e(t), w(t) represent input-/output flows on the local bus lines, while m is determined by the position of the rate multiplier 212 and can assume seven values, between 0.1 and 1.0. As shown in FIGS. 2A and 2B there are two local bus lines from each processor module to each of the four neighbouring modules in positions N,S,E,W. For ease of distinguishing the two set of local bus lines the first set of local bus lines is termed N,S,E,W and the second set is termed n,s,e,w, but there is no fundamental difference between them. See further Table II for definition of corresponding pins in the rear socket of the processor module.

As shown in FIG. 7B the principal circuit in the LEVEL module is an analog integrator 210 with a reset circuit 213. The values to be integrated are signals from RATE or DIFFUSION modules on the local bus lines (n,s,e,w). The signals are added in an adder 211 and multiplied by a constant (0.1, 0.2, 0.5, 1, 2, 5 or 10) in a rate multiplier 212 to permit proper scaling.

Output from the integrator 210 is supplied via a buffer 214 to the local bus lines N, S, E, W and to two output front-plate connectors 215, 216.

The integrator 210 is reset to an initial value selected by a potentiometer 217, or by a value from the input front-plate connector 218. Normally distributed noise may be added to the initial value from an internal noise generator via a potentiometer 220. An error detector 221 senses internal overflow in the LEVEL module circuit. The overflow is indicated by a lamp 222.

The initial value of the variable is established in one of the two following ways:
  the numerical initial value between 0 and 10 is set by the initial ten-turn potentiometer 217.
  the initial value can be defined externally and transmitted to the LEVEL module by the front-plate connector 218.

The inflow to the module is carried out by placing RATE or DIFFUSION modules as neighbours to the LEVEL module in any of the positions N, S, E, W (see FIG. 7A).

The output from the LEVEL module can either be a RATE or a DIFFUSION controlled flow or information about the contents of the LEVEL:
  flows travel to any of the neighbouring modules via local bus lines n, s, e, w, (FIG. 7A).
  information is available to any of the neighbouring modules and also through the two front-plate connectors 215, 216.

The time-varying contents of the LEVEL can be shown both in the "run" and in the "scan" period.

RATE Module

The RATE module shown in FIGS. 8A and 8B simulates a flow from one LEVEL (source) to another LEVEL (sink). The LEVEL modules can be omitted, if they represent exogenous variables. There is no initializing of the RATE module.

The flow is calculated by the following combination of input variables: A(t)+B(t)+C(t)−D(t), all with default values of 0. The values A(t), B(t) are input signals from neighbouring modules in the positions N,W or N,E or S,E or S,W or E,W or N,S, and the values C(t) and D(t) are input signals at the front-plate connectors 223 and 224 respectively.

In the multiply/divide circuit 225 the above expression can be multiplied or divided (selectable by the switch 226) by the constant K, which is adjusted by a potentiometer 227.

Regardless of the input values N, S, E, W and C(223) and D(224) the output from the RATE module can be set equal to 0 by a stop command signal from the stop circuit 228 to the switch circuit 230. The stop circuit 228 produces a stop command signal to the switch circuit 230 if switch 229 is is closed and one of the following conditions are true:
  a binary input to front-plate connector EXT. 231 is active,
  the source level is less than the parameter value coupled to front-plate connector MIN 232,
  the sink level is larger than the parameter value coupled to front-plate connector MAX. 233.

As shown in FIG. 8B the RATE module comprises interchangeable IN/OUT selector submodules 234 to direct any combination of flow from a SOURCE LEVEL to a SINK LEVEL. The submodules 234 are plugged into the front plate of the RATE module to select a desired flow rate through the RATE module in accordance with an arrow on the surface of the submodule 234. Output from the multiply/divide circuit 225 through switch circuit 230 and output buffer 235 is supplied to IN/OUT selector submodule 234 and to front-plate connector 236. The signal (+OUT) to control the SOURCE LEVEL making it decrease is the opposite polarity of the signal (−OUT) to control the SINK LEVEL making it increase with the same amount as the SOURCE LEVEL.

The flow rate is shown on the monitors 29,30 both in the "run" period and in the "scan" period.

Error detector 238 senses internal overflow in the RATE module circuit. The overflow is indicated by a lamp 239.

AUXILIARY Module

The auxiliary module shown in FIGS. 9A and 9B performs arithmetic calculations. There is no initializing of the AUXILIARY module.

The module calculates the expression:

$$(A +/- B +/- C) \cdot \frac{D}{10} \cdot \frac{\frac{10}{F}}{\frac{F}{10}}$$

where input parameter values for B, C, D and F are selected the input selector 241 from local bus lines N, S, E, W. Parameter value for A is supplied by the front-plate connector 242. The stroke / indicates choice alternatives selected by the switch group 243, 244, 245, 246 (FIG. 9A). The switch 243 selects the sign (+/−) for B, the switch 244 selects the sign (+/−) for C, switch 245 selects the factor K or 1/K, and switch 246 selects the factor 10/F or F/10. The value of K is defined by the ten-turn potentiometer 247 (K). Default values: A=B=C=0; D=1 and E=10.

As shown in FIG. 9B the principal circuits in the AUXILIARY module is two four quadrant transconductance multipliers 248, 249.

The IN/OUT selector 241, which comprises five mechanical dual in-line switches operated from the front plate of the AUXILIARY module (see FIG. 9A), distributes input, from the local bus lines N, S, E, W and from front-plate connectors 242 and 250 to the add/subtract circuit 251, via buffer 253 to the multiply/divide circuit 252 and via the buffer 254 to the multiply/divide circuit 249.

The output can be directed from the multiply/divide circuit 249 via buffer 255 and via IN/OUT selector 241 to the local bus lines N, S, E, W and to the front-plate connector 250.

The output from the module is shown both in the "run" and in the "scan" period.

Error detector 256 senses internal overflow in the AUXILIARY module. The overflow is indicated by a lamp 257.

NOISE Module

The NOISE module shown in FIGS. 10A and 10B is used to simulate
1. a constant or a stochastic variable
2. a stochastic binary variable.

There is no initializing of the NOISE module.

The two functions of the module are separately described in the following:

re 1: The output of the variable is described by the following expression:

$$N(t) = A + ST(t)$$

where the numerical value of A is defined by the ten-turn potentiometer 260. ST(t) is a stochastic variable with the mean value 0. The choice by the switches 262 indicates the type of distribution for ST(t). The module gives the possibility to approximate any one of the following distribution types:
Normal distribution
Rectangular distribution
Positive exponential distribution
Negative exponential distribution.

re 2: The output front plate connector 263 is a stochastic binary variable, 1 or 0. The probability for the value 1 is equal to A/10, where A is adjusted by the ten-turn potentiometer 260.

The principal circuit in the NOISE module is an avalanche noise generator 264 which utilizes the avalanche noise in a solid state diode 265 to generate substantially normally distributed noise. Output from the output buffer 266 is directly distributed to all the local bus lines N, S, E, W and to the front plate connector 267 (OUT). The output consists of a mean value selected by the potentiometer 260 (MEAN) and one out of four noise distributions square, + exponential, − exponential and normal, selected by the switch 262.

In square shaper circuit 268 the normal distribution is shaped by zener diodes in the feedback loop of an operational amplifier to generate a square distribution. In + exponential shaper circuit 269 and in − exponential shaper circuit 270 the normal distribution is shaped to generate an exponential distribution. The stochastical variations are converted into binary values by comparator-integrator circuit 271 (STOP), which detects signal values above a predetermined level adjustable by the potentiometer 260 to generate a stochastic binary variable which is supplied to front-plate connector 263 (STOP). The binary output, supplied to the connector 263 (STOP), is defined by a dutycycle selected by the potentiometer 260 (MEAN).

There is no input signal to the NOISE module. If the module is used as a constant or a stochastic variable, the output is directed to all neighbouring modules and the output is available from the front-plate connector 267.

If the module is used as a stochastic binary variable, the output can only be obtained through the front-plate connector 263.

The value of the variable described under 1 is shown both in the "run" and the "scan" period. Output described under 2 cannot be shown on the monitor directly.

TABLE Module

The TABLE module shown in FIGS. 11A and 11B describes a functional relationship between two parameters (y=f(x)). There is no initializing of the module.

The inlay of the curve is carried out by a front-end computer 25, CRT-terminal 31, digitizer 33, and a colour monitor 30 (FIG. 1). The curve is described by a grid of pixes on the colour monitor.

This front-end computer system gives the following editing facilities:
Inlaying of curves by digitizer 33.
Interpolation (linear or smoothed).
Listing of fix points.
Altering fix points.
Altering scale (0 ... 10), (0 ... 5), (−10 ... 10), (−5 ... 5) for both the x- and the y-axis.
Defining a name for the table function.
Storing and retrieving of table functions from a tape station (personal casette 32).

The principal circuit in the TABLE module is a Random Access Memory 272 controlled by Programmable Array Logic. The RAM 272 is updated by the front-end computer 25, via the channel unit 23, the switching network 18, the switch 274 to select input or output from the Receiver/Transmitter (UART) 275, to the Random Access Memory 272. A high quality line is established by control readings from the RAM 272 and retransmission, until the data set in the module (RAM) is equal to a selected data set in the front-end computer 25.

A status word in the memory 276 controls the Input selector 277, the Input scaler 278, the Output scaler 283 and the Output selector 284. The scaling axes are (−10 V to 10 V), (0 V to 10 V), (−5 V to 5 V) or (0 V to 5 V).

The delay from input to output, with 8 bit A/D conversion 279, lock-up in the RAM 272 and D/A 280 conversion, is about 3 μs.

Input value to the table function (the x-coordinate) is defined through one of the four local busses N, S, E, W or through the front-plate connector 281. If one of the four internal input ports is applied, the input port must be selected by a CRT-terminal 31, otherwise the axis is identical with the time axis.

Output from the table function (the y-coordinate) can be selected to one of the four local busses N, S, E, W (specified by the CRT-terminal 31) and/or through the front-plate connector 282.

The output from the table functions is shown in the "run" period, and the table function is shown in the "scan" period.

DELAY Module

The DELAY module shown in FIGS. 12A and 12B simulates a delay in time, e.g. time of delivery. The output is equal to the delayed input. There is no initializing of the DELAY module.

Using the local bus lines N, S, E, W and a front-plate connector 306(B) the input entrance is selected by the switch 300, while the output is selected by the switch 301. The delay time is normally defined by the potentiometer 302, unless the external entry 303 is used.

Sensitivity analysis according to the value of the delay time can be performed automatically. The delay time is then changed by an internal noise generator 304.

Using the switch 305, it is possible to choose either an exponential or a normal distribution for the delay time.

The principal circuit in the DELAY module is a bucket brigade delay line 309. Input is selected from the local bus lines N, S, E, W or from connector 306(B) in the "run" period, but a step or a pulse is selected in the "scan" period by an analog switch 307.

An active low-pass input filter 308 reduces the band width to avoid high frequencies to fold into the used frequency band by the sampling process at the first bucket.

The bucket brigades 309 are clocked by a time (VCO) 310, controlled by a potentiometer (DELAY) 302, or by the front-plate connector 303.

A further exponential delay (SMOOTH) is available by a variable R.C.—circuit 311 followed by a filter 312 to limit VHF-noise from the clock. The DC-level is initialized before each simulation by the chopper 313, before the output is distributed to the local bus lines N, S, E, W or to the front-plate connector 306 (B).

The output is shown in the "run" period. In the "scan" period, the delayed output of a pulse/step input at time t=0 is shown. The choice between step and pulse input is selected by the switch 314.

WAVE-FORM Module

The WAVE-FORM module shown in FIGS. 13A and 13B can generate different time functions (exponential, sine, triangle, square, single pulse, pulse train, clock pulse, and ramp). There is no initializing of the module.

The desired type of time function is selected by the switch 320. The following table shows the possibilities for changing the form of the time functions:

| FUNC-TIONS | FRE-QUENCY | PHASE | WIDTH | AMPLITUDE min. | max. |
|---|---|---|---|---|---|
| Exponential | | | | x | x |
| Sine | x | x | | x | x |
| Triangle | x | x | | x | x |
| Square | x | x | | x | x |
| Single Puls | x | x | x | x | x |
| Puls train | x | x | x | x | x |
| Clock puls | x | x | | x | x |
| Ramp | | | | x | x |

The frequency is adjusted by a potentiometer 321, the phase by a potentiometer 322 and the pulse width by 323. The minimum value of the time function is adjusted by 324 and the maximum value by 325.

The principal circuit in the WAVE FORM modules is an integrated function generator 326 driven by an oscillator 329 and a circuit defining the phase 317. The frequency and phase of the function generator are selected by potentiometers 321,322 or by the corresponding front-plate connectors 327,328. The square wave output from 326 is further shaped by flip flops in a pulse circuit 331 with variable pulse width controlled by a potentiometer 323 or by a front-plate connector 330.

The autoscale circuit 328 scales the signals by detecting minimum and maximum values during each simulation. The offset 316 is slowly increased, if the output falls below the selected MIN-value 324, and the multiplying factor is slowly reduced if the MAX-value 325 is exceeded.

The output is directly distributed to local bus lines N, S, E, W and to an output connector 319.

When using one of the two time functions, single pulse or pulse train, the pulse width can be controlled by an exogenous variable through the front-plate connector 330. The frequency and the phase for the time functions sine, triangle square, single pulse, pulse train and clock pulse can be controlled by exogenous variables through the front-plate connectors 327 and 328.

Output is obtained through the local bus lines N, S, E, W, and through the front-plate connector 319 (OUT).

The output of the module is shown both in the "run" period and in the "scan" period.

MAX-MIN Module

The MAX-MIN module shown in FIGS. 14A and 15B selects the largest/lowest value among inputs. There is no initializing of the module.

By a switch 332 on the front-plate of the module it is specified whether the module should select the largest of the lowest value among the inputs. The selected input variable is indicated by the yellow lamps in the middle of the module 361.

Selection of a channel for output is performed by the switch 362. The selected output channel is indicated by one of the green lamps 333 in the middle of the front plate of the module. The remaining of the seven channels can then be used for input.

The principal circuit in the MAX-MIN module is a Programmable Array Logic controller 334 (FIG. 14B). Input from eight lines N, S, E, W, 336, 338, 340, 342, are connected two and two by comparators 343, 344, 345, 346, connected to the PAL controller 334. Switches 347, 348, 349, 350, select the largest or the smallest of the input signals to be connected to stage two (351, 352, 353, 354), in the tree structure, and to stage three (355, 356) until the global max- or min-value is selected.

An output switch 362 selects one of the said eight lines as output and gives the PAL-controller 334 a signal to turn on a green LED 333 to mark the line as well as to block input from it.

The binary state of one of the inputs (selected (=1) or non-selected (=0) is distributed to the output connector 357.

As input entrance to the module the local bus lines N, S, E, W and/or the front-plate connectors 336, 338, 340, 342 may be used.

Output may be obtained through one of the local bus lines N, S, E, W or by one of the four front-plate connectors 336, 338, 340, 342.

Output from the module to the front-end 12 can be selected by the circuit OUT 358 selecting output from the buffer 359 or selecting information about the selected input from the LED driver 360.

Steps with values corresponding to the input number are shown as a time function on the color monitor 29 or 30. These steps represent the period in which an input is selected.

LOGIC-SWITCH module

By the LOGIC-SWITCH module shown in FIGS. 15A and 15B it is possible to change the structure of a simulation model.

The criteria for changing the structure are defined by the result of a logic expression containing up to three inequalities. The initializing is achieved by the switch 365 which defines the initial stage of the flip flop 383 (manually operated) to be true or false.

Three inequalities are defined by comparators 366, 367, 368. The first inequality is defined with the front plate connectors 369, 370 and 371, the second inequality with the front-plate connectors 372 and 373, and the third inequality with front-plate connectors 374 and 375. The default values are true, true, and false respectively.

By means of 369, 370 and 371, the following inequalities can be defined, depending on the position of the manually operated front-plate switch 376.

switch 376 connected to the comparator 366: The inequality is true, when input from 369 < input from 370 < input from 371 (default: true).
  switch 376 connected to the flip flop 383: The expression is true, when input from 370 becomes larger than input from 371 and remains true until it becomes less than input from 369.

In this way the module has three logic expressions, where each of them can be either false or true. The result is calculated by the logic coherence of I, II and III, where the Roman numbers are inequalities defined by comparators 366, 367 and 368 respectively:

| I | II | III | RESULTANT |
| --- | --- | --- | --- |
| T | T | T | T |
| T | F | T | T |
| F | T | T | T |
| F | F | T | T |
| T | T | F | T |
| T | F | F | F |
| F | T | F | F |
| F | F | F | F |

The flow routes through the module are indicated on the front-plate of the module by green lamps 377 driven by 382 and established by the manually operated front-plate selector 378. By means of 378 it is specified, whether or not the switches in 379 and 380 should be open or closed, when the resultant logic expression is true or false respectively. In this way connection lines between neighbouring modules can be established. By the manually operated selector 378, the front-plate connector 381 can be defined as being 1, when the resultant logic expression is true, and 0, when it is false, and any combination.

The principal circuit in the LOGIC-SWITCH is two analog switch networks 379, 380. Both sets of local bus lines N, S, E, W and n, s, e, w, are interconnected by the analog switches. N can be connected to E, E to S, S to W and W to N. The interconnections are indicated by green light emitting diodes 377 supplied by the driver 382.

Both in the "run" and the "scan" period, a curve is shown with the value 1, when the resultant logic expression is true, and the value 0, when it is false.

CORRELATOR Module

The correlator module which is shown in FIGS. 16A and 16B simulates the weighted sum of a sampled input. There is no initializing of the module.

The primary circuit in the CORRELATOR module is a tapped bucket brigade circuit 417. The input to the CORRELATOR module is selected from the local bus lines N, S, E, W and a front plate connector 418. The AC-part of the input signal travels through the bucket brigade 417 which operates as a transversal filter with a 32 points discrete weight function adjustable with miniature potentiometers 428 on the front-plate of the module. The DC level is reestablished by choppers 419, 420 and the output is shaped by a sample and hold circuit 421. The output can be further delayed by an adjustable smooth circuit 422, before it is distributed to local bus lines N, S, E, W and front plate connector 418.

The bucket brigade is driven by a driver 423, a flip flop 424 controlled by a timer 425. The timer 425 defines the clock frequency by a potentiometer 426 or by the input from front plate connector 427.

Output is shown in the "run" period. In the "scan" period, the input is set equal to a pulse placed at time = 0. Output in the "scan" period is, therefore, showing the weighting factors in the 32 cells before the summing in 428.

DIFFUSION Module

The DIFFUSION module shown in FIGS. 17A and 17B simulates the flow through a boundary area between the two compartments. The module is used in relation to LEVEL parameters, which are of relative character (intensive parameter), where the relation between the input flow and the output flow is opposite proportional to the volumes of source level and sink level. The positive direction of the flow is symbolized by an arrow at the submodule 400 inserted in a socket through the front-plate of the DIFFUSION module.

The principal circuit in the DIFFUSION module is IN/OUT submodule 400 to direct any combination of flow from a SOURCE LEVEL to a SINK LEVEL. Output is distributed to the SINK and SOURCE LEVELS by the local bus lines n, s, e, w. Input from other modules than SINK or SOURCE are supplied by selected ones of the local bus lines N, S, E, W and added to input from the front-plate connector 401 and 402. The sum calculated by the ADD circuit 403 is multiplied or divided in the MULTIPLY circuit 404 by a constant K defined by the potentiometer 405. The signal is then separated by the NUM-VALUE circuit 406 into a numerical part 407 and a sign 408 to permit use of a one-quadrant divider 409 in connection with a switch network 410. The numerical value is then multiplied by the ratio between V1 and V2 from front-plate connectors 411 and 412, respectively, and the sign is again inserted by inverting amplifiers and a switch network 410. An error detector 416 senses and indicates internal overflow in the DIFFUSION module circuit.

By means of the switch 415 it is possible to select, whether the IN-RATE 414 or the OUT-RATE 413 should be shown on the color monitor (29 or 30). The expressions are shown both in the "run" and in the "scan" period.

SAMPLE Module

The SAMPLE module shown in FIGS. 18A and 18B performs sampling of an input. Only the last sampled value is stored. The initial values are defined by a potentiometer 385.

The principal circuit in the SAMPLE module is a sample and hold circuit 389 driven by the driver 394. The input is selected from local bus lines N, S, E, W and from front-plate connectors 386 and 387. A switch 390 is used to insert a ramp in the "scan" period and to insert initial values selected by 395 and defined by a potentiometer 385 in the run period. The number of simulation cycles between the inserting of an initial value is controlled by a timer 391 and a potentiometer 396.

Several SAMPLE modules interconnected via the front-plate connector 390 can be driven synchronously by one timer 391.

The sample rate is determined by another timer 388 controlled by a potentiometer 389 or by input from the local bus lines N, S, E, W, or from the front-plate connectors 386 or 387. The timer can be reset by a logical signal from input connector 392 (HOLD).

The output can be exponentially delayed by the SMOOTH circuit 393, before it is supplied to the local bus lines N, S, E, W and to the front-plate connectors 386 and 387.

In the "run" period, the output from the sampling is shown. In the "scan" period, the input to the module is a ramp, and a sampling of this ramp is shown as output.

In FIG. 1C is illustrated a second embodiment of the invention comprising electronic hardware processor modules 10, one electronic planning board 11 including e.g. 8×8 multiconnection sockets, a front-end system 112 and a color monitor 129 built into the front-end system 112. The front-end system communicates with the electronic planning board 11 and the processor modules 10 via a multipole cable. This wiring and the circuitry in planning board 11 are substantially identical with the corresponding wiring and circuitry disclosed in connection with the first embodiment of the invention. Similarly, the circuitry of the processor modules 10 is substantially identical with the circuitry in the corresponding modules of the first embodiment of the invention,. In front-end system 112 the front-end computer 25 and the peripheral units 30, 31, 32, 33 and 34 are omitted. Apart from this the embodiment shown in FIG. 1C is identical with the first embodiment of the invention shown in FIG. 1A in respect of use and operation.

What we claim is:

1. A modular simulator and signal processing system for interactive simulation or signal processing of dynamic systems, said modular simulator and signal processing system comprising
    a plurality of basic electronic hardware processor modules including at least one module producing information signals which describe system states of a dynamic system, at least one module producing information signals which describe flow to and from a system state of a dynamic system, and at least one module responsive to input signals thereto to control said at least one module which produces system states describing information signals and said at least one module which produces flow describing information signals;
    peripheral display units for providing visual displays; and
    an electronic planning board having sockets in which said hardware processor modules are placeable for mounting on said electronic planning board to build a flow diagram structure model of dynamic systems to be signal processed or simulated, said electronic planning board including local bus means coupled between only neighboring sockets on said electronic planning board for transferring information signals between neighboring modules placed in said sockets on said electronic planning board, whereby the modules operate in parallel, so that the time for simulating or signal processing of models of dynamic systems is maintained constant at a predetermined maximum magnitude of approximately 10 msec independent of the size or complexity of the simulated model, and whereby the result of a simulation is displayed on said peripheral display units, and comprising a system clock for dividing the simulation or signal processing cycle of predetermined duration into periods having a first interval in which said hardware processor modules are reset, a second interval in which said hardware processor modules simulate or signal process a model, a third interval in which said hardware processor modules are reset, and a fourth interval in which said hardware processor modules are simulated or signal processed as individual models to permit adjusting of parameters for said simulation or signal processing, and comprising a plurality of means each connected to a corresponding one of said hardware processor modules, an encoder circuit, a channel monitor circuit, a switching network, a decoder and color light emitting means, said means generating by suitable activation a first code sequence, a second code sequence or a third code sequence, said first code sequence providing, via said encoder circuit, said channel monitor circuit and said switching network, an information signal path between a hardware processor module of said plurality of hardware processor modules on which said means has been activated in said first code sequence, said display units displaying the result of said simulation or signal processing in a selected color in a first graphic curve mode corresponding to information signals of said second interval of said simulation or signal processing cycle, said color light emitting means being connected to said hardware processor module on which said means has been activated in said first code sequence, and showing said selected color via said channel monitor circuit and said decoder, said second code sequence providing, via said encoder circuit, said channel monitor circuit and said switching network, an information signal path between a hardware processor module of said plurality of hardware processor modules on which said means has been activated in said second code sequence, said display units displaying the result of said simulation or signal processing in a selected color in a second graphic curve mode corresponding to information signals of said fourth interval of said simulation or signal processing cycle, said color light emitting means being connected to said hardware processor module on which said means has been activated in said second code sequence, and showing said selected color via said channel monitor circuit and said decoder, and said third code sequence cancelling information signal output from said hardware processor module on which said means has been activated in said third code sequence.

2. A modular simulator and signal processing system for interactive simulation or signal processing of dynamic systems, said modular simulator and signal processing system comprising
    at least one module producing information signals which describe system states of a dynamic system, said module including at least a level module simulating the contents over time of an input signal applied thereto; and at least one other module producing information signals which describe flow to and from a system state of a dynamic system, said other module including at least a rate module simulating flow from a first system state of a dynamic system to a second system state of a dynamic system, and comprising at least another module responsive to input signals applied thereto for controlling said at least one module which produces system state describing information signals and said at least one other module which produces flow describing information signals, said at least another module including at least an auxiliary module performing arithmetic calculations, at least a noise module simulating a constant or stochastic variable and a stochastic binary variable, at least a table module simulating a functional relationship between two parameters, at least a delay module simulating a delay in time, at least a waveform module generating exponential, sine, triangle, square, single pulse train, clock pulse and ramp time functions, at least a max-min module producing selection of the largest or lowest of the input values applied thereto, at least a logic switch module producing logic expressions of true and false, at least a correlator module simulating the weighted sum of a sampled input, at least a diffusion module simulating flow through a boundary area and at least a sample module which samples an input signal applied thereto.

* * * * *